United States Patent [19]

Thornhill

[11] Patent Number: 4,469,552

[45] Date of Patent: Sep. 4, 1984

[54] PROCESS AND APPARATUS FOR GROWING A CRYSTAL RIBBON

[75] Inventor: Jay W. Thornhill, Pasadena, Calif.

[73] Assignee: The United States of America as represented by the Administrator of the National Aeronautics and Space Administration, Washington, D.C.

[21] Appl. No.: 371,351

[22] Filed: Apr. 23, 1982

[51] Int. Cl.³ .................... C30B 15/34; C01B 33/02
[52] U.S. Cl. ............... 156/608; 156/617 SP; 156/617 V; 156/DIG. 64; 156/DIG. 88; 156/DIG. 98; 422/246; 422/249
[58] Field of Search ............. 156/608, 617 SP, 617 V, 156/622, 624, DIG. 64, DIG. 83, DIG. 88, DIG. 98; 422/246, 249; 65/187, 193

[56] References Cited

U.S. PATENT DOCUMENTS

| | | | |
|---|---|---|---|
| 3,015,592 | 1/1962 | Leopold | 156/608 |
| 3,198,606 | 8/1965 | Lyons | 156/608 |
| 3,265,469 | 8/1966 | Hall | 156/617 SP |
| 3,954,551 | 5/1976 | Cecil et al. | 156/DIG. 88 |
| 4,121,965 | 10/1978 | Leipold | 156/608 |
| 4,299,648 | 11/1981 | Ciszek et al. | 422/246 |

FOREIGN PATENT DOCUMENTS

| | | | |
|---|---|---|---|
| 65781 | 5/1977 | Japan | 156/608 |
| 2041781 | 9/1980 | United Kingdom | 422/249 |

OTHER PUBLICATIONS

Ciszek, T. F. and Hurd, J. L., "Melt Growth of Silicon Sheets by Edge-Supported Pulling", Solar Energy Research Institute, Nov., 1980.

Primary Examiner—David L. Lacey
Attorney, Agent, or Firm—Paul McCaul; Thomas H. Jones; John R. Manning

[57] ABSTRACT

A process and apparatus is disclosed for growing a crystal ribbon (42) of a substance of theoretically infinite length from a melt (32) of the substance. A pair of fixedly positioned edge defining members (44) are partially submerged into the melt (32) so as to break the surface (34) of the melt (32) at a predetermined distance from one another. The edge defining members (44) are wettable by the melt and the predetermined distance substantially corresponds to the width of the crystal ribbon (42) to be grown. The crystal ribbon (42) is grown by contacting the surface (34) of the melt (32) with a seed ribbon (38) between the edge defining members (44) whereby a meniscus (48) of the melt (32) is established on the seed ribbon (38). The meniscus (48) is stabilized by the meniscus (50) of the melt (32) on the edge defining members (44). Pulling the seed crystal ribbon (38) away from the melt (32) results in continuous growth of the crystal ribbon (42).

8 Claims, 9 Drawing Figures

PROCESS AND APPARATUS FOR GROWING A CRYSTAL RIBBON

BACKGROUND OF THE INVENTION

1. Origin of the Invention

The invention described herein was made in the performance of work under a NASA Contract and is subject to the provisions of Section 305 of the National Aeronautics and Space Act of 1958, Public Law 85-568 (72 STAT 435; 43 USC 2457).

2. Background of the Invention

The present invention is directed to an apparatus and process for growing a crystal ribbon of indefinite length from the melt of a substance. More particularly, the present invention is directed to an apparatus and process for growing a crystalline ribbon of silicon from a mass of molten silicon for semiconductor device purposes.

3. Brief Description of the Prior Art

Several methods are known in the prior art for growing crystals of a substance from a melt of the substance. Many processes of the prior art are particularly adapted for growing ingots or ribbons of crystalline silicon from a silicon melt. However, relatively recent advances in semiconductor, and related technology, and particularly the recently increasing demand for photovoltaic cells capable of directly converting sunlight into electric energy, have greatly increased the qualitative and quantitative requirements for crystalline ribbons of silicon.

As is well known in the art, crystalline silicon used in photovoltaic cells must particularly be formed in thin ribbons or "wafers," ideally having large surface areas. Furthermore, the semiconductor material used in photovoltaic cells ideally should be entirely monocrystalline, although this requirement can be relaxed by accepting poorer cell performance. Practically, the silicon ribbons or "wafers" used in photovoltaic cells should have as high a degree of crystal perfection as possible.

In order to illuminate the background of the present invention, the prior art processes and apparatus for growing silicon ingots and ribbons for semiconductor and photovoltaic purposes are briefly described as follows. A melt of silicon is maintained in a suitable container, such as a quartz crucible, under a suitable inert gas atmosphere. A properly oriented seed crystal of silicon is dipped into the melt. The temperature of the melt is controlled and adjusted so that the silicon tends to crystallize on the seed, because of a thermal gradient in the direction of the cooler seed. Thereafter the seed crystal is pulled upward from the melt in a direction substantially normal to the melt surface, causing molten silicon to crystallize onto the seed crystal at the liquid solid interface. The resulting crystalline body continuously grows substantially until the process is deliberately interrupted, or the supply of molten silicon is exhausted.

While the above-noted crystal growing process is in progress, the melt must be carefully maintained at the proper temperature so that molten silicon material solidifies at the solid liquid interface rather than melts the solid crystal. Furthermore, in industrial processes, the melt may be continuously or intermittently replenished by addition of silicon (usually in the form of solid granules) and the velocity of pulling the solid crystal away from the melt must be carefully controlled. In order to satisfy the above-noted requirements, the prior art provided relatively reliable, sophisticated apparatus and instrumentation which, by-and-large, function well. An apparatus adapted for accomplishing the pulling function is generally referred to in the art as Czochralski type apparatus. Certain embodiments of the above-noted apparatus and instrumentation for monitoring and maintaining the temperature of the melt, sensing the level of the melt and automatically replenishing the same, and the mechanism for controlled pulling of the solid crystal away from the melt, are presently available in the United States on a commercial basis.

The above-summarized process works well for growing silicon ingots of substantially circular cross-section. However, the ingots must be sliced into thin sections, or "wafers" to be useful in semiconductor device technology. On the other hand, the growing of silicon crystals of another cross-sectional configuration such as, for example, silicon ribbons, presents additional problems. In order to grow a crystalline ribbon, it is necessary to provide foreign objects or members in the melt to define, or at least partly define a meniscus of liquid silicon of the desired configuration on a continuously shifting liquid-crystal interface.

One of the specific techniques of the prior art of the above-noted nature for growing crystalline silicon ribbons, utilizes a die positioned in the molten silicon. The die characteristically protrudes to a slight extent above the level of liquid silicon in the crucible, and incorporates an opening which is narrow enough for the liquid silicon to rise to the top surface of the die by capillary action. The seed crystal ribbon is then brought into contact with and is subsequently pulled away from the top surface of the die.

The techniques for growing crystalline silicon with the assistance of a die wettable by liquid silicon are generally termed in the art "capillary die" techniques. Examples of this technique and apparatus for performing the same may be found in U.S. Pat. Nos. 3,650,703; 4,075,055; 4,090,851; 4,099,924; 4,116,641; 4,121,965, and United States Published Patent Application No. B 584,997.

Another example of a technique which utilizes a die having an opening is found in U.S. Pat. No. 4,211,600. The die of this patent is, however, not wettable by liquid silicon and the liquid silicon is caused to rise in the opening of the die by application of pressure.

Another category of specific techniques used in the art for growing silicon crystals is termed the "dendritic web" technique. It involves the use of silicon dendrites, i.e., two spaced-apart silicon crystals which are dipped into the melt, and are allowed to propagate downwardly into the melt while being slowly pulled in an upwardly direction. The growth between the dendrites provides a crystalline web or ribbon of silicon.

Yet a third category of silicon crystal growing technique is termed "edge supported pulling technique." In accordance with this technique, two spaced-apart filaments of a suitable material, such as quartz or graphite, are dipped into a melt of silicon, a ribbon-shaped seed crystal is touched to the surface of the melt between the two filaments, and thereafter the seed crystal is pulled away from the melt together with the filaments. In this technique, the meniscus of liquid silicon at the interface with the end of the ribbon-like seed crystal is stabilized on the edges of the seed crystal by the respective filaments. A detailed description of the edge-supported pulling technique may be found in a paper prepared by T. F. Ciszek and J. L. Hurd of the Solar Energy Research Institute for the U.S. Department of Energy, titled "Melt Growth of Silicon Sheets by Edge-Supported Pulling."

Other patents and publications of general relevance to silicon crystal growing techniques and to the subject matter of the present application for patent are U.S. Pat. No. 4,242,553, an article by John Lenzing, "Survey of Semiconductor Crystal-Growing Processes and Equipment," Solid State Technology, February, 1975, pages 34–43, and an article by C. P. Chartier and C. B. Sibley, "Czochralski Silicon Crystal Growth at Reduced Pressures," Solid State Technology, February, 1975, pages 31–33.

The above-noted prior art methods suffer from certain disadvantages, particularly when the methods are considered for producing large quantities of silicon ribbons for photovoltaic applications. More specifically, the die utilizing or "capillary die" techniques are inherently limited in the dimensions of the crystals which may be grown by the technique, because the opening in the die must be narrow enough to permit rise of the melt in the opening by capillary action. Furthermore, it is difficult to maintain adequate thermal control in the "capillary die" processes, and the foreign matter of the die tends to promote polycrystalline growth. As a result, silicon ribbons prepared by the capillary die technique are polycrystalline and therefore provide photovoltaic material that cannot attain as good a performance as single crystal material.

A disadvantage of the "dendritic web" technique for growing silicon ribbons is that thermal control of the process is somewhat difficult, and the crystal growth is difficult to initiate, although the resulting single crystal ribbon serves very well for relatively high efficiency photovoltaic applications.

Thermal control of the "edge supported pulling technique" is relatively easy, and this technique also gives rise to polycrystalline material with large crystallites conducive to relatively high efficiency photovoltaic performance. However, the length of a ribbon grown by the edge supported pulling technique is necessarily limited, because the two edge supporting filaments of finite length are pulled out of the crucible together with the growing ribbon. Although this disadvantage of the edge supported pulling technique might theoretically be overcome by continuously supplying two filaments of indefinite length to be pulled from the silicon melt, no acceptable, practical apparatus of this type has been devised in the prior art.

An additional disadvantage of both the "dendritic web" and of the "edge supported pulling" processes is that the crystal ribbon obtained in both processes is bounded on its elongate edges by the dendrites or by the filaments, respectively. The dendrites or filaments must be removed from the crystal ribbon before the ribbon is cut and incorporated in photovoltaic devices.

Other processes of the prior art which give rise to silicon ingots rather than ribbons, suffer from the serious disadvantage that for photovoltaic and most other applications the ingots must be sliced into thin sections or "wafers" at relatively great cost and waste.

In light of the foregoing it is readily apparent that a need exists in the prior art for a technique for directly and relatively inexpensively producing crystalline ribbons of silicon which are highly adapted for use in photovoltaic cells and other semiconductor devices. The present invention serves to satisfy this need.

SUMMARY OF THE INVENTION

It is an object of the present invention to provide an apparatus and process for continuously growing a crystalline ribbon of silicon or other material, from a melt of the material.

It is another object of the present invention to provide an apparatus and process for continuously growing a crystalline ribbon of silicon, or other material, from a melt of the material wherein the edges of the ribbon are free of concomitantly grown dendrites or foreign substance edge defining members.

It is still another object of the present invention to provide an apparatus and process for continuously growing a crystalline ribbon of silicon, or other material, from the melt of the material, wherein the control of the process is relatively easily maintained.

It is yet another object of the present invention to provide an apparatus and process for continuously growing a crystalline ribbon of silicon from molten silicon, wherein the resulting ribbon is highly suitable for use in photovoltaic cells.

These and other objects and advantages are attained by a technique used in association with substantially conventional crystal pulling equipment, wherein a pair of edge defining members are fixedly positioned and stationarily mounted relative to a container. The container holds a melt of silicon or other material from which a crystal ribbon is to be pulled. The edge defining members are partially submerged in the melt at two spaced-apart locations which substantially correspond to the width of the desired crystal ribbon. The edge defining members are wettable by the melt, and partially protrude above the melt surface. Consequently, when a seed crystal ribbon is contacted with the melt and with the edge defining members, the edge defining members help to stabilize a meniscus of molten silicon around the periphery of the seed ribbon. Proper adjustment of the temperature and temperature gradient will allow subsequent pulling of the seed ribbon in a direction substantially normal to the surface of the melt to stabilize the meniscus defined by the edge defining members and results in the growth of a crystalline ribbon of indefinite length and of high photovoltaic quality.

The features of the present invention can be best understood, together with further objects and advantages, by reference to the following description taken in connection with the accompanying drawings, wherein like numerals indicate like parts.

DESCRIPTION OF THE PREFERRED EMBODIMENTS

The following specification taken in conjunction with the drawings sets forth the preferred embodiments of the present invention in such a manner that any person skilled in the crystal growing arts can use the invention. The embodiments of the invention disclosed herein are the best modes contemplated by the inventor for carrying out his invention, although it should be understood that various modifications can be accomplished within the parameters of the present invention.

Referring now to FIGS. 3–9, the crystal growing apparatus and process of the present invention are disclosed. It should be noted at the outset, that the crystal growing apparatus and process of the present invention are primarily adapted for growing crystalline ribbons of silicon from a melt of silicon. However, the hereinafter disclosed generic principles, process, and apparatus may also be utilized for growing crystalline ribbons of other materials, such as tungsten or molybdenium. As is well known in the art, the latter two materials are hard to roll and therefore hard to obtain in a ribbon-like configuration. However, in the ensuing description the crystalline ribbon grown in accordance with the present invention is referred to as a silicon ribbon. This is for the sake of simplicity and clarity of expression, and because the present invention is primarily directed to growing crystalline silicon ribbons. Furthermore, as it was pointed out in the introductory section of the present application for patent, long, thin, ideally monocrystalline, or at least large grain polycrystalline ribbons of silicon are the essential components of photovoltaic solar cells, and as such have tremendous scientific, industrial and commercial importance.

It should be further noted, that many components of the overall crystal pulling equipment, wherein the present invention is utilized, are constructed in accordance with the state-of-the-art. The overall equipment incorporating a second preferred embodiment of the apparatus of the present invention, is schematically shown on FIG. 9, and is described here only to the extent necessary to understand the present invention. For a more detailed description of the state-of-the-art components of a crystal pulling apparatus utilized in conjunction with the present invention, reference is made to the article "Survey of Semiconductor Crystal-Growing Processes and Equipment," by John Lenzing, Solid State Technology, February 1975, pages 34–43, which is expressly incorporated herein by reference.

Figure 9:
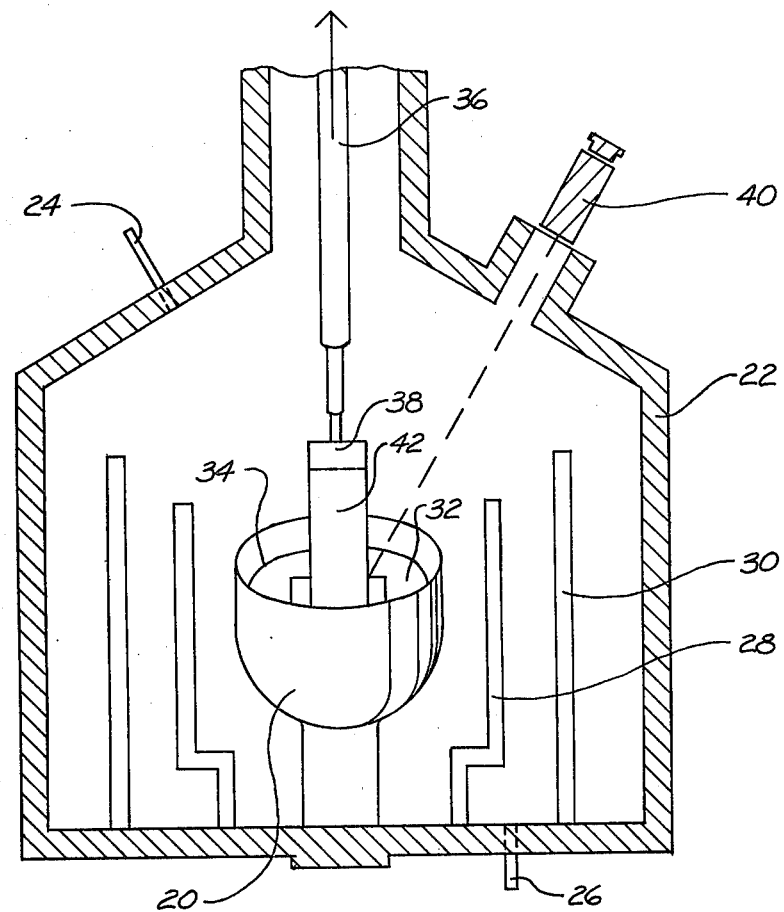
FIG. 9 is a schematic view, partly in cross-section, illustrating the environment wherein the novel crystal pulling apparatus is utilized.

Thus, briefly and with principal reference to the schematic view of FIG. 9, the crystal pulling equipment (Czochralski type equipment) includes a crucible or container 20 which is mounted within an enveloping water cooled chamber 22. An appropriate inert gas, such as argon or helium, is continuously passed through the chamber 22 through a gas inlet 24 and outlet 26. Usually a resistance heater 28 is utilized to surround and heat the crucible or container 20, although the heater 28 is often a susceptor that may be heated by RF induction. A shield 30 of insulating material surrounds the heater 28 and inhibits loss of heat outwardly in the direction of the chamber 22.

The crucible 20 is made of high purity quartz or graphite, because these materials are capable of withstanding the temperatures necessary to melt silicon, and are relatively stable when in contact with molten silicon 32. The crucible 20 may be of various capacity; in present-day industrial applications the crucible 20 may contain tens of kilograms of molten silicon.

In large scale industrial use, the level 34 of molten silicon 32 is usually maintained in the crucible 20 at a predetermined height, or in a predetermined range of height. An apparatus adapted for automatically maintaining the level 34 of molten silicon 32 in the crucible 20 by addition of silicon granules is not shown on FIG. 9.

A pull rod 36 is disposed above the crucible 20. It is connected to a pulling mechanism (not shown) which permits precise controlled movement of the rod 36 in a direction substantially normal to the level 34 of liquid silicon 32 in the crucible 20. The pulling mechanism (not shown) may be designed to pull and take up crystal rods, ingots or ribbons of up to several meters in length.

A lower part of the pull rod 36 is adapted to clamp a seed crystal 38, or crystal dendrites (not shown) or a seed crystal together with quartz or graphite filaments, as it is explained in the introductory section of the present application for patent in connection with the description of the prior art "edge supported pulling technique." A detector system, usually utilizing a narrow band infrared detector, may continually observe a meniscus at a liquid-crystal interface and control the replenishment of silicon 32 in the crucible 20. The infrared detector is schematically shown on FIG. 9 and bears the reference numeral 40.

The principal function of the above-summarized crystal growing equipment is to lower the seed crystal 38 into the melt 32, and thereafter gradually pull the seed crystal 38 away from the melt under precisely controlled conditions of temperature and pulling speed so that molten silicon is gradually supplied to the crystal liquid interface by capillary action, and gradually crystallizes to give rise to a crystal. It should be emphasized at this point that the present invention principally lies in the manner of utilizing and stabilizing a properly shaped meniscus on the liquid-crystal interface so as to provide for growth of a ribbon-shaped silicon crystal of, at least in principle, infinite length. Although, when the crystal pulling process is in progress, the seed crystal 38 may not be visually distinguishable from the growing crystal 42, on FIG. 9 the seed crystal 38 is separately indicated by dotted lines.

Figure 3:
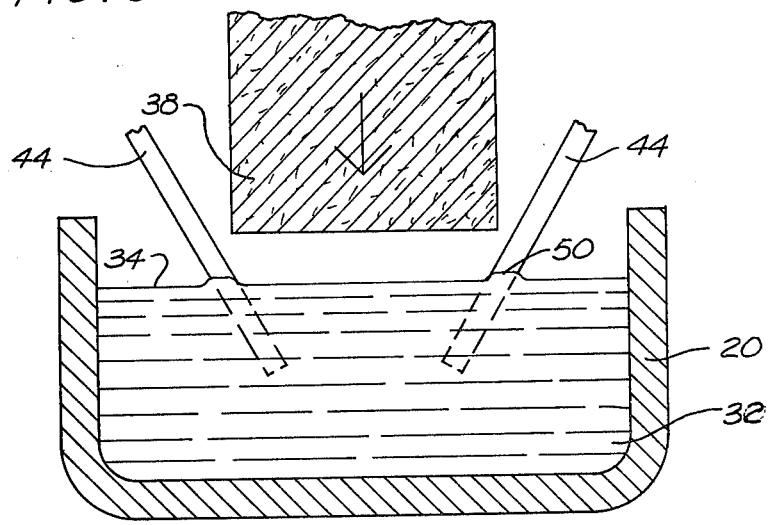
FIG. 3 is a schematic view, partly in cross-section, illustrating a first preferred embodiment of the crystal pulling apparatus of the present invention, the view also illustrating a step of lowering a seed crystal ribbon into a melt in the process of the present invention.
Figure 4:
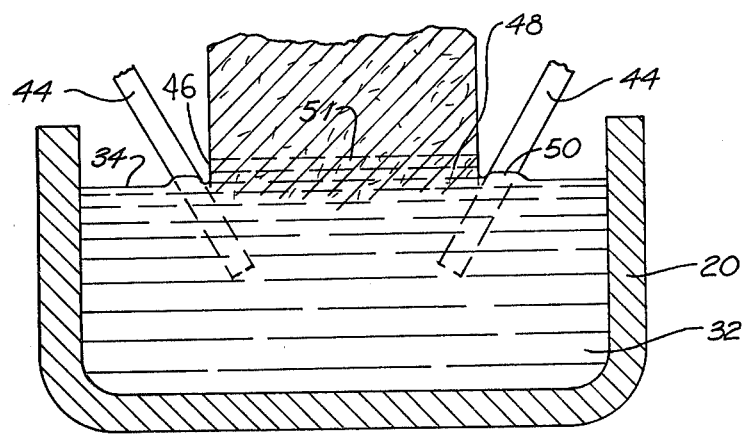
FIG. 4 is a schematic view, partly in cross-section, illustrating the first preferred embodiment of the crystal pulling apparatus of the present invention, the view also illustrating a step of contacting the seed crystal ribbon with the melt, in the process of the present invention.
Figure 5:
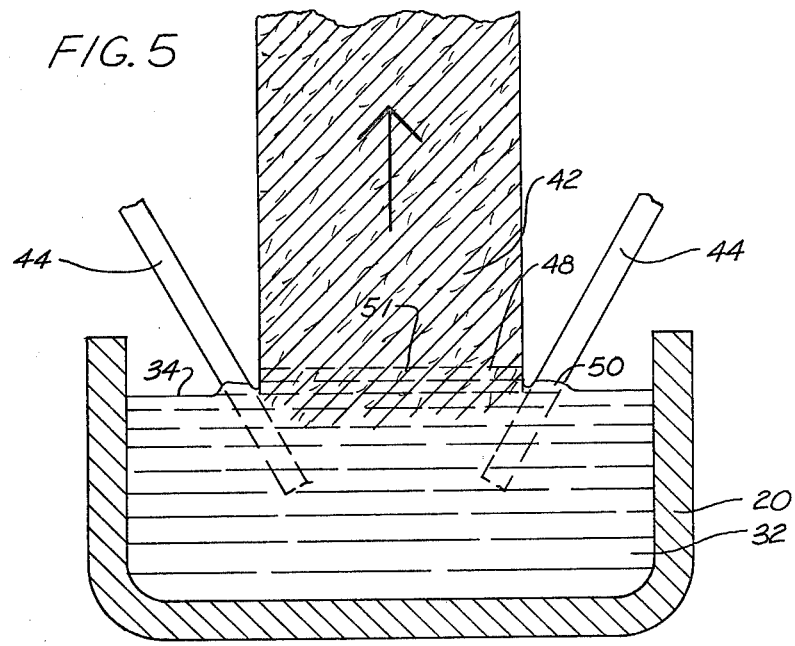
FIG. 5 is a schematic view, partly in cross-section, illustrating the first preferred embodiment of the crystal pulling apparatus of the present invention, the view also illustrating a step of pulling a growing crystal ribbon away from the surface of the melt.

Thus referring now to FIGS. 3, 4 and 5, a pair of edge defining members 44 are shown partially submerged in a melt of silicon 32 contained in a crucible 20. Although this is not shown on FIGS. 3, 4 and 5, the crucible 20 comprises a part of the Czochralski type crystal pulling equipment briefly described above with reference to FIG. 9.

The edge defining members 44 are made of a material which is wettable by molten silicon and chemically compatible therewith. Thus, the edge defining members 44 are preferably made of quartz or graphite, although carbon, silicon carbide, and silicon nitride are also suitable for the construction of the edge defining members 44. The cross-sectional shape of the edge defining members 44 is not critical, neither is their thickness. Quartz or graphite filaments of round cross-section and having a diameter of approximately 1-3 mm serve well in the present invention.

Figure 1:
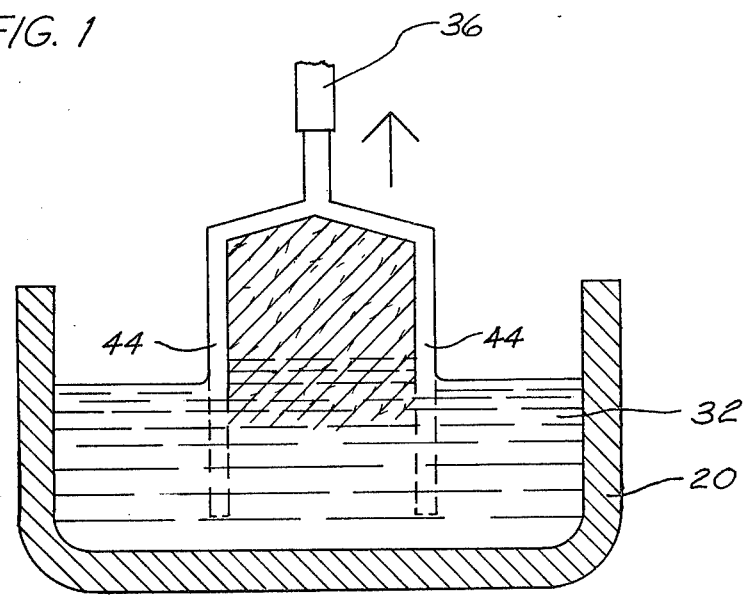
FIG. 1 is a schematic view, partly in cross-section, illustrating an "edge supported" crystal pulling technique of the prior art.
Figure 2:
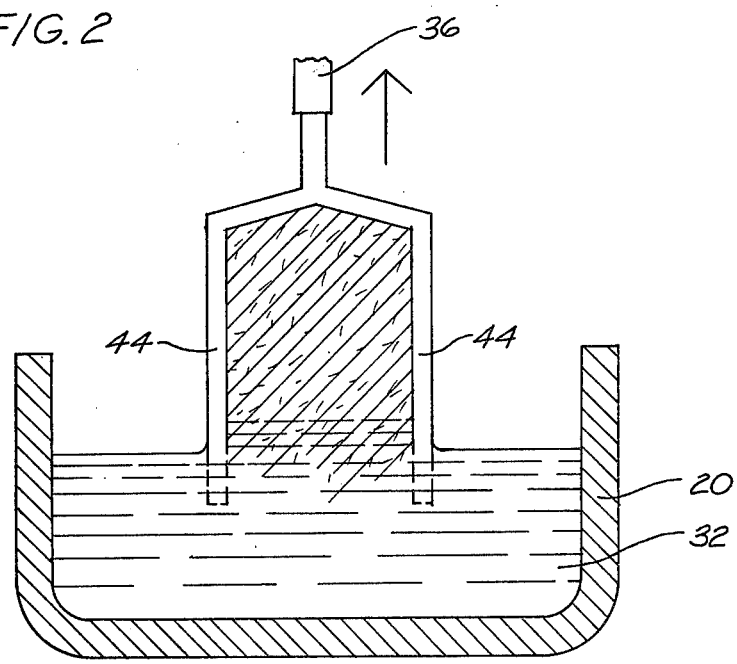
FIG. 2 is another schematic view, partly in cross-section, illustrating an "edge supported" crystal pulling technique of the prior art.

It is a critical feature of the present invention that the edge defining members 44 are stationarily mounted relative to the crucible 20 and to the liquid silicon 32 contained therein, so as to break the surface or level 34 of the melt 32 at a fixed, predetermined distance from one another. The edge defining members 44 may be fixedly mounted to a rigid structure disposed substantially above the crucible 20, or in any other manner, the exact mode of stationarily mounting of the edge defining members 44 not being critical. What is critical is that the edge defining members 44 are fixed and do not move during the entire crystal pulling process practiced in accordance with the present invention. This is in sharp contrast with the prior art edge supported pulling technique, shown in FIGS. 1 and 2, wherein the meniscus stabilizing filaments 44 are withdrawn from the melt 32 together with the growing crystal ribbon 42.

Because the edge defining members 44 are submerged into the melt, and are wettable thereby, the molten silicon 32 rises on the periphery of the edge defining members 44 due to surface tension. This is shown on FIG. 3. Furthermore, in the first preferred embodiment of the apparatus and process of the present invention, shown in FIGS. 3, 4 and 5, the edge defining members 44 are disposed in an angular relationship relative to the level or surface 34 of the melt 32. More accurately stated, in the first preferred embodiment wherein the edge defining members 44 are fixedly mounted substantially above the crucible 20, the edge defining members 44 are disposed tapered relative to one another so that a distance between the two edge defining members 44 increases with increasing distance from the surface 34 of the melt 32. This is amply illustrated in FIGS. 3, 4 and 5, and serves the purpose of permitting a seed crystal ribbon 38 to contact the surface 34 of the melt 32 between the edge defining members 44 and to be pulled from the surface 34 without interference from the edge defining members 44.

Another important feature of the present invention is that the edge defining members 44 are disposed at a distance from one another which corresponds to the width of the crystal ribbon 42 desired to be grown. This distance may vary up to approximately 5-10 centimeters.

FIG. 3 illustrates the disposition of the edge defining members 44 in the crucible 20 as the seed silicon crystal ribbon 38 is lowered to contact the surface 34 of the melt 32. The seed crystal ribbon 38, in accordance with the present invention, is substantially as wide as the distance between the edge defining members 44 on the surface 34 of the melt 32. Thus, as it was noted above, the seed silicon crystal ribbon 38 may be up to approximately 5-10 centimeters wide. The thickness of the seed crystal ribbon 38 may vary approximately between 200 microns to 3 millimeters. As it will become apparent from the ensuing description, the above-noted cross-sectional dimensions of the seed crystal ribbon 38 are also substantially the cross-sectional dimensions of the silicon crystal ribbon 42 which is produced in accordance with the present invention. Furthermore, the above-noted dimensions or limits of the crystal ribbon 42 are principally determined by the requirement that the crystal ribbon 42 grown in accordance with the present invention be uniform in cross-section. Experience has shown that if the ribbon is substantially wider or thicker than the above-noted limits, then uneven cooling occurs during the crystallization process with resultant buckling of the ribbon 42.

FIG. 4 shows the seed crystal ribbon 38 in contact with the surface 34 of the melt 32, and also in contact with the edge defining members 44 at its lower lateral edges 46. As is shown in FIG. 4, the seed crystal ribbon 38 and the edge defining members 44 cause the liquid silicon 32 to rise to a certain height on the seed crystal ribbon 38, and to establish a meniscus 48 thereon. The meniscus 48 is stabilized by the edge defining members 44. Theoretical calculations and experience show that the meniscus 48 on the substantially flat silicon seed crystal ribbon 38 is approximately 6 to 7 millimeters above the level of the melt 32 in the crucible 20. A meniscus 50 of the liquid silicon 32 on the edge defining members 44 is substantially lower, as is shown on FIG. 4. This is highly advantageous because as the seed crystal ribbon 38 is gradually pulled away from the surface 34 of the melt 32, liquid silicon crystallizes in a liquid-crystal interface area 51 which is not in immediate contact with the foreign substance of the edge defining members 44. Consequently, the silicon ribbon 42 obtained in accordance with the present invention is highly monocrystalline, i.e., contains relatively few, but large crystals of silicon. Therefore, the silicon ribbon 42 obtained in accordance with the present invention is very well suited for use in photovoltaic cells (not shown).

An additional advantage of the present invention is that more freedom for selecting the proper seed ribbon crystal orientation is possible than in the prior art edge supported pulling technique. This is because of the substantial absence of foreign substance in the liquid crystal interface. As is known in the prior art edge supported pulling technique, certain seed ribbon crystal orientations are utilized to overcome the undesirable effect of the foreign substance of the edge defining filaments on the crystal growth.

FIG. 5 shows a step in the process of the present invention wherein the growing silicon ribbon 42 is pulled away from the melt 32. During this step, the liquid-crystal interface 51 is continuously maintained by continuous rise of the molten silicon 32 by capillary action. Throughout this entire crystal growing process the edge defining members 44 maintain and stabilize the ends of the meniscus 48 on the growing crystal 42. Pulling speeds in the process of the present invention, as in the prior art, vary according to the dimensions of the crystal ribbon 42, and are, generally speaking, approximately in the 1 to 2.5 cm/min range.

As it should be apparent from the above description, and in contrast with the prior art, the length of the crystalline ribbon 42 which is grown in accordance with the present invention is not limited by the length of the edge defining members 44. In a crystal growing apparatus wherein the silicon melt 32 is automatically replenished in the crucible 20, and therefore the level 34 of the melt 32 is substantially maintained in a predetermined range, the length of the crystal ribbon 42 is limited substantially only by the capacity of a conventional take-up apparatus (not shown). A silicon crystal ribbon 42 grown in accordance with the present invention is schematically in FIG. 8.

Figure 6:
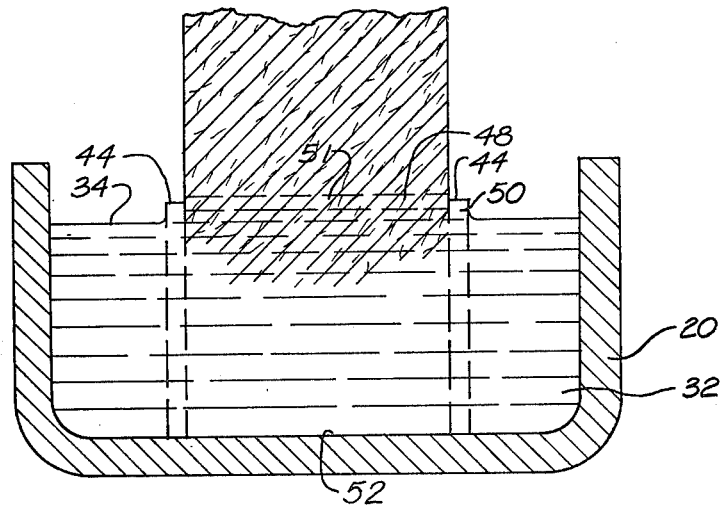
FIG. 6 is a schematic view, partly in cross-section, illustrating a second preferred embodiment of the crystal pulling apparatus of the present invention.
Figure 7:
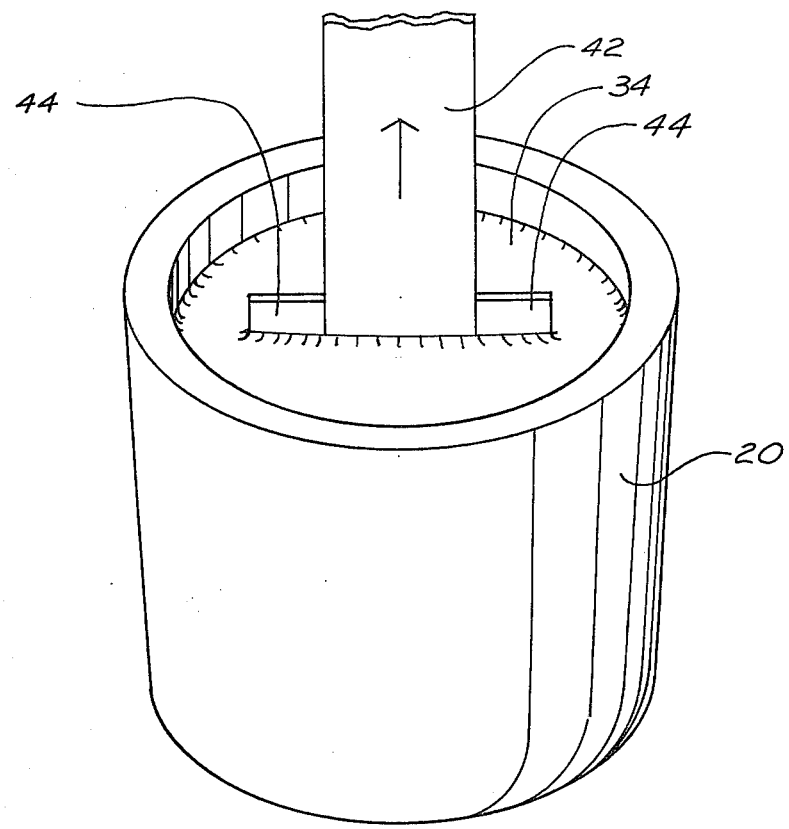
FIG. 7 is a schematic perspective view illustrating the second preferred embodiment of the crystal pulling apparatus of the present invention.
Figure 8:
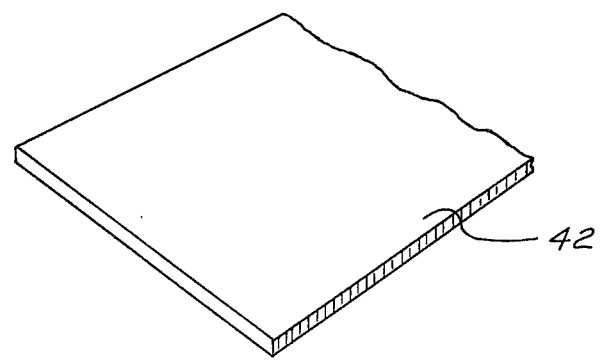
FIG. 8 is a partial perspective view illustrating a crystal ribbon pulled in accordance with the present invention.

Referring now to FIGS. 6 and 7, a second preferred embodiment of the crystal pulling apparatus of the present invention is shown. The second preferred embodiment differs principally from the first preferred embodiment only in that in the second preferred embodiment the edge defining members 44 are fixedly mounted to the crucible 20 rather than to some other part of a rigid structure. The mode of fastening the edge defining members 44 to the crucible 20 is not critical; quartz filaments acting as the edge defining members 44 may, for example, be fixed to a bottom 52 of the crucible 20. It is critical, however, to position the edge defining members 44 at a distance from one another, which, at least on the surface 34 of the melt 32, corresponds to the width of the crystal ribbon 42 to be pulled.

The edge defining members 44 of the second preferred embodiment protrude slightly above the surface 34 of the melt 32 so that a meniscus 50 is established on the edge defining members 44. However, as is shown on FIG. 6, it is advantageous for the edge defining members 44 to protrude to a lesser distance from the melt 32 than the expected height of the meniscus 48 on the seed crystal ribbon 38 or on the growing crystal ribbon 42. This is because the liquid-crystal interface 51 is then established substantially above the edge defining members 44, and therefore crystallization occurs in substantial absence of foreign material. As it was explained above, this promotes substantially monocrystalline growth.

In all other substantial aspects, the second preferred embodiment of the present invention operates in the same manner as the first preferred embodiment. Thus, the seed crystal ribbon 38 is lowered to the surface 34 of the melt 32, and is thereafter pulled in an upwardly direction away from the melt 32 to give rise to a crystal ribbon 42 of indefinite length and of high degree of crystal perfection.

The crystal ribbon 42 grown in accordance with the present invention has no dendrite rails or foreign substance filaments attached to its longitudinal edges. This represents an additional advantage over the prior art "dendritic" or "edge supported pulling" techniques, because in the prior art the dendritic rails or filaments, as applicable, must be removed from the crystal ribbon.

Several modifications of the hereinabovedescribed apparatus and process may become readily apparent to those skilled in the art in light of the above disclosure. Therefore, the scope of the present invention should be interpreted solely from the following claims.

What is claimed is:

1. An apparatus for growing a crystalline ribbon of silicon from molten silicon, said ribbon substantially having the cross-section of a relatively wide and thin rectangle, the apparatus comprising:
    a heatable container adapted to holding said molten silicon, said molten silicon having an upper surface level which is within a predetermined range in the container;
    a pair of edge defining members fixedly positioned and stationarily mounted relative to the container, each member being partially submerged in the molten silicon and having a portion which protrudes from the molten silicon above the upper surface level, the two members being of a material compatible with molten silicon and wettable thereby and breaking the upper surface level of the molten silicon at two spaced apart locations;
    said edge defining members being filaments fixedly mounted relative to the heatable container at points disposed above the upper level of the molten silicon, said filaments being substantially straight and disposed at an angle other than 90 degrees relative to the upper level of molten silicon in the container so that the distance between the filaments increases with increasing distance upwards from the upper level of the molten silicon in the container; and
    a means for contacting a silicon seed crystal of a width corresponding to the distance between the edge defining members at the upper surface level with the molten silicon between the members and for gradually pulling the seed crystal away from the molten silicon in a direction substantially normal to the upper surface level whereby a crystalline silicon ribbon of indefinite length is grown.

2. The apparatus of claim 1 wherein the material of the edge defining members is selected from the group consisting of quartz, carbon, graphite, silicon carbide and silicon nitride.

3. The apparatus of claim 1 or 2 wherein the distance between the locations wherein the filaments break the upper surface level of the molten silicon is between 1 to 5 cm.

4. A process for producing a crystalline ribbon of indefinite length and of a substantially rectangular cross-section from a melt of silicon, said process comprising the steps of:
    maintaining a melt of silicon in a heatable container;
    maintaining a pair of edge defining members in a fixed position relative to the container and in a spatial relationship wherein each edge defining member is partially submerged in the melt and partially protrudes therefrom, the edge defining members being of a material which is wettable by molten silicon and breaking the upper surface of the molten silicon at two fixed spaced apart locations;
    said edge defining members being filaments fixedly mounted relative to the heatable container at points disposed above the upper level of molten material, said filaments being substantially straight and disposed at an angle other than 90 degrees relative to the upper level of molten silicon in the container so that the distance between the filaments increases with increasing distance upwards from the upper level of the molten silicon in the container; and
    contacting a silicon seed crystal ribbon with the upper surface of the molten silicon between the edge defining members so that respective lateral edges of the seed crystal ribbon also contact the respective edge defining members at the two spaced apart locations, whereby a meniscus of molten silicon in formed under the seed crystal ribbon, and between the edge defining members, and
    pulling the seed crystal ribbon away from the upper surface of the melt in a direction substantially normal to the melt, whereby the crystalline silicon ribbon of substantially the same cross-section as the seed crystal is grown from the melt.

5. The process of claim 4 wherein the material of the edge defining members is selected from the group consisting of quartz, carbon, graphite, silicon nitride and silicon carbide.

6. The process of claim 4 wherein the two spaced apart locations are at a distance of 1 to 5 cm from one another.

7. The process of claim 6 wherein the seed crystal is 200 microns to 3 mm thick.

8. The process of claim 7 wherein the speed crystal ribbon is pulled away from the melt at a speed between 1 to 2.5 cm/min.

* * * * *